United States Patent [19]

Bacon et al.

[11] Patent Number: 4,785,261

[45] Date of Patent: Nov. 15, 1988

[54] MAGNETICALLY INSULATED TRANSMISSION LINE OSCILLATOR

[75] Inventors: Larry D. Bacon; William P. Ballard; M. Collins Clark; Barry M. Marder, all of Albuquerque, N. Mex.

[73] Assignee: The United States of America as represented by the United States Department of Energy, Washington, D.C.

[21] Appl. No.: 51,562

[22] Filed: May 19, 1987

[51] Int. Cl.[4] .......................... H03B 9/08; H03B 9/10

[52] U.S. Cl. ....................................... 331/82; 315/3.6; 315/39.3; 315/39.75; 331/86

[58] Field of Search ........................ 331/79, 81, 82, 83, 331/86, 87, 90, 91, 96; 315/3.5, 3.6, 39, 39.3, 39.51, 39.53, 39.75

[56] References Cited

U.S. PATENT DOCUMENTS 2,439,401 4/1948 Smith .............................. 315/39.75

OTHER PUBLICATIONS

Buneman, "A Toroidal Magnetron", Proc. Phys. Soc., London, VB-63, 1950, pp. 278-288.

Collin, *Foundation for Microwave Engineering,* McGraw-Hill, New York, N.Y., 1966, pp. 482-484.

Bekefi et al., "Microwave Emission From Magnetically Insulated Relativistic Electron-Beam Diodes", First IEEE International Pulsed Power Conference, 1976, pp. IIC6-2-IIC6-11.

Shope et al., "Self-Magnetic Insulation in Vacuum for Coaxial Geometry ", J. Appl. Phys. 49(7), Jul. 1978, pp. 3675-3678.

*Primary Examiner*—Siegfried H. Grimm

*Attorney, Agent, or Firm*—George H. Libman; James H. Chafin; Judson R. Hightower

[57] ABSTRACT

A magnetically insulated transmission line oscillator employs self-generated magnetic fields to generate microwave energy. An anode of the oscillator includes slow-wave structures which are formed of a plurality of thin conductive vanes defining cavities therebetween, and a gap is formed between the anode and a cathode of the oscillator. In response to a pulsed voltage applied to the anode and cathode, self-generated magnetic fields arfe produced in a cross-field orientation with respect to the orientation of the electric field between the anode and the cathode. The cross-field magnetic fields insulate the flow of electrons in the gap and confine the flow of electrons within the gap.

9 Claims, 7 Drawing Sheets

MAGNETICALLY INSULATED TRANSMISSION LINE OSCILLATOR

The United States Government has rights in this invention pursuant to Contract No. DE-AC04-76DP00789 between the United States Department of Energy and A T & T Technologies, Inc.

FIELD OF THE INVENTION

The present invention relates to the field of oscillators for producing microwave energy, and more particularly to microwave oscillators employing magnetic insulation for insulating high voltage gaps in the oscillators.

BACKGROUND OF THE INVENTION

In high frequency oscillators that magnetically insulate the region or a "gap" in which electrons flow from cathode to anode, the magnetic insulation is provided by a magnetic field that is generated from external electromagnets. However, in this type of insulation there is a need to constantly match the voltage applied to the oscillator with the magnetic field supplied by the electromagnets. It would be desirable to provide a microwave oscillator that does not require such voltage matching.

Because magnetically insulated microwave oscillators require two power sources, one to energize the oscillator and another to establish the magnetic insulating field by the external electromagnets; there is a tendency toward electrical breakdown as higher applied voltages are approached. It naturally is desirable to reduce this breakdown tendency as high voltages are approached.

Known microwave oscillators using magnetic insulation tend to have a high inherent impedance. Such devices are used for plasma heating, electromagnetic effects, and RF accelerator applications. This high impedance severely limits the power level at which the oscillators can operate. It accordingly would be desirable to provide a microwave oscillator that has a lower inherent impedance than known oscillators to operate at significantly higher power levels.

There are numerous devices for producing microwaves using slow-wave structures (slow-waves are waves having phase velocity less than the speed of light). Therein an electron beam interacts with fundamental oscillation modes of the device, and the interaction produces microwave energy at the expense of beam energy. However, known microwave oscillators using slow-wave structures employ magnetic fields applied by external magnets to provide magnetic insulation, and have the disadvantages characterized above.

In Bekefi et al, Microwave Emission from Magnetically Insulated Relativistic Electron-Beam Diodes, 1st IEEE International Pulsed Power Conference, 1976, there is a suggestion that self-generated magnetic fields could be self-generated within a cathode of a non-slow-wave magnetically insulated microwave generator.

Microwave generators are generally plagued with the problem of "chirping" when voltage variations are applied thereto (chirping is defined as changes in frequency of the produced microwave energy as a function of changes or variations in voltage applied to the microwave generator). The voltage variations are generally unplanned and difficult to control, and the resulting chirping is an undesirable characteristic that is difficult to prevent.

SUMMARY OF THE INVENTION

It is an object of the invention to provide a magnetically insulated microwave oscillator in which external electro-magnets for supplying insulating magnetic fields are not required.

Another object of the invention is to provide a magnetically insulated microwave oscillator that has a lower inherent impedance than known oscillators to enable the oscillator to operate at significantly higher power levels.

Still another object of the invention is to provide a magnetically insulated microwave oscillator in which there is a reduced tendency toward electrical breakdown at high voltages.

Another object of the invention is to provide a microwave generator that does not exhibit changes in produced frequencies in response to applied voltage variations.

Yet another object of the invention is to provide a magnetically insulated microwave energy generator in which the output frequency is readily varied.

An object of the invention is to provide an output coupler for a microwave oscillator that is less limited with respect to its power handling capability.

Another object of the invention is to provide a microwave coupler that combines outputs from both sides of the oscillator to improve operating efficiency.

To achieve the foregoing and other objects, and in accordance with the purposes of the present invention as described herein, an improved magnetically insulated microwave oscillator is provided in which pulsed voltage is applied to an anode and a cathode of the oscillator, and the anode is a slow-wave structure comprising a plurality of periodically arrayed conductive vanes which extend from a support surface of the anode toward the cathode. The vanes are arrayed as a family of parallel surfaces with cavities defined between the vanes.

Microwave energy is generated by interaction of electrons flowing parallel to the cathode with the electromagnetic fields propagating through the slow-wave structure. This interaction produces intense electron bunching and robust microwave radiation.

When suitable pulsed electric power is applied to the arrangement of the slow-wave anode and the cathode of the oscillator, a self-generated magnetic field is produced perpendicular to the electric field between the anode and cathode. The magnetic field insulates the flow of electrons in the gap between the anode and cathode; that is, the self-generated magnetic field confines the electron flow to the gap region between the anode and cathode. The magnetically insulated transmission line oscillator of the invention operates in a vacuum.

In accordance with another aspect of the invention, the frequency of the microwaves generated is varied by varying the depth of the cavities. The magnetically insulated microwave oscillator of the invention in effect is a magnetically insulated transmission line oscillator, i.e., a "MILO".

In accordance with a further aspect of the invention, the magnetically insulated transmission line oscillator is planar, coaxial or concentric. In a planar embodiment of the oscillator, a planar magnetically insulated transmission line oscillator includes a family of vanes extending perpendicular from a planar anode vane support toward a planar cathode. In one type of coaxial embodiment of the oscillator, line oscillator includes a family of vanes in the form of flat circular vanes extending from an outer cylindrical anode vane support toward an inner rod-like cathode. The family of vanes is arranged in parallel planes along an elongated cathode. In another type, i.e., an inverted coaxial oscillator, a family of vanes in the form of flat vanes extends from an inner elongated anode vane support toward an outer cathode. The family of vanes is arranged in parallel planes along the anode support. In a concentric embodiment of the oscillator, a family of vanes in the form of cylindrical vanes extends from a flat anode vane support toward a flat cathode. The family of vanes is in the form of cylindrical wall segments of successively increasing radii.

The magnetically insulated transmission line oscillator of the invention can be operated in either a line-limited mode or a load-limited mode. In the line-limited mode of operation, the outer and inner conductors of the oscillator are the anode and cathode respectively, and the transmission line includes only the anode and cathode. However, in the load-limited mode, the transmission line includes a load. The microwave output can be tuned to a specific frequency. Self-generated direct magnetic fields facilitate charge transport parallel to the central conductor. Microwaves are generated by the interaction of TEM waves in the slow wave structure with the space-charge flow. The interaction is strongest when the wave phase velocity is approximately equal to the charge drift velocity, and the charge flow fills the space between the inner and outer conductors. In load-limited operation, independent adjustment of current gain is obtainable.

In accordance with another aspect of the invention, a coupler is provided for coupling microwaves from a magnetically insulated transmission line oscillator to a microwave radiator. A first reflector reflects microwaves away from one end of the oscillator. A waveguide receives the reflected waves from the first reflector and directs the reflected waves to the microwave radiator.

A second reflector reflects microwaves away from the opposite end of the oscillator. A second waveguide receives the reflected waves from the second reflector and directs the reflected waves to the microwave radiator.

The coupler may include planar reflectors, waveguides, and a planar magnetically insulated transmission line oscillator. Alternatively, the coupler may include reflectors that are hollow and conical. The waveguide may be cylindrical, and the magnetically insulated transmission line oscillator may be coaxial.

In accordance with another aspect of the invention, a microwave oscillator and a coupler assembly direct microwaves to a microwave radiator. The assembly includes a cathode and an anode including slow-wave structure. A support for the vanes is slotted enabling microwave energy to radiate from cavities defined by the vanes. A power source provides pulsed power to the cathode and the anode for producing a flow of electrons and an electric field in the gap between the anode and cathode. Self-generated magnetic fields are produced in a cross-field orientation with respect to the orientation of the electric field between the anode and a cathode. The magnetic cross-fields insulate the flow of electrons in the gap and confine the flow of electrons within the gap.

A first reflector reflects microwaves travelling in the cavities away from one end of the oscillator. A wave guide receives the reflected waves from the first reflector and directs the reflected waves to the microwave radiator. A second reflector reflects microwaves travelling in the cavities away from the opposite end of the oscillator. Another waveguide receives the reflected waves from the second reflector and directs the reflected waves to the microwave radiator.

The amount of power that is coupled from the assembly is adjustable by controlling the reflectors to reflect more or less microwave energy radiating from the cavities.

In accordance with another aspect of the invention, a microwave oscillator and coupler assembly has a first anode and first gap above the upper surface of the cathode and has a second anode and second gap below the lower surface of the cathode. Thus, the cathode is located between the top anode and the bottom anode.

The coupler, in accordance with the invention, receives microwaves that radiate from the microwave cavities in both the upper and lower anodes and reflects the microwaves into the receiving waveguide. Thus, an upper reflector reflects microwaves received from the upper anode, and a lower reflector reflects microwaves received from the lower anode.

In accordance with another aspect of the invention which employs an inverted coaxial magnetically insulated transmission line oscillator, an additional novel means regulates the flow of microwaves through cavities to a coupler. The inner anode vane support is in the form of a hollow cylinder around which the vanes defining cavities project. Slots are provided in the cylindrical anode support to permit microwaves to propagate from the microwave cavities and enter the interior of the hollow anode support. The hollow anode support serves as a wave guide for transmitting the microwaves to a microwave radiator.

Passage of microwaves from the cavity, through a slot, and into the waveguide interior of the anode support is controlled by a novel dual wire loop. The loop provides a high current, low voltage controlling device for controlling the flow of microwaves from the cavities to the waveguide. The high current and low voltage of the dual loop reduce electrical breakdown problems that otherwise tend to occur at a high microwave power.

Dual coupling loops not only couple energy out of the cavities, but, also provide a means for selecting certain microwave energy modes. For example, dual coupling loops permit TE11-type microwave modes to enter the cylindrical waveguide by coupling to the magnetic field present in the waveguide. At the same time, the dual coupling loops prevent undesired TMOn microwave modes from entering the waveguide.

By using dual coupling loops for controlling passage of microwaves through slots in the hollow cylindrical anode support of an inverted coaxial magnetically insulated transmission line oscillator, a fixed-polarization pencil beam of microwaves emerges from a conical horn microwave radiator located at one end of the hollow anode support.

Still other objects of the present invention will become readily apparent to those skilled in this art from the following description, wherein there is shown and described a preferred embodiment of this invention. Simply by way of illustration, the invention will be set forth in part in the description that follows and in part will become apparent to those skilled in the art upon examination of the following or may be learned with the practice of the invention. Accordingly, the drawings and descriptions will be regarded as illustrative in nature and not as restrictive.

BRIEF DESCRIPTION OF THE DRAWINGS

The accompanying drawings incorporated in and forming a part of the specification, illustrate several aspects of the present invention, and together with the description serve to explain the principles of the invention. In the drawings:

FIGS. 4A–4C are graphs depicting computer simulated relationships within a planar self-generated, magnetically insulated oscillator of the invention; wherein:

FIG. 4A is a graph of spectrum of microwave frequencies produced by the oscillator, FIG. 4B is a graph of cyclic variation of the longitudinal electric field, and FIG. 4C is a graph of variation in other cavities with respect to the seventh cavity for the period between 10 and 20 ns.

DETAILED DESCRIPTION OF A PREFERRED EMBODIMENT OF THE INVENTION

With reference to the drawings, and more particularly to FIGS. 1A–1D, there is disclosed a planar embodiment of the magnetically insulated transmission line oscillator of the present invention. FIGS. 1A–1D show schematically a sequence of electron distributions within the assembly, as voltage is applied to the anode and cathode thereof.

Figure 1B:
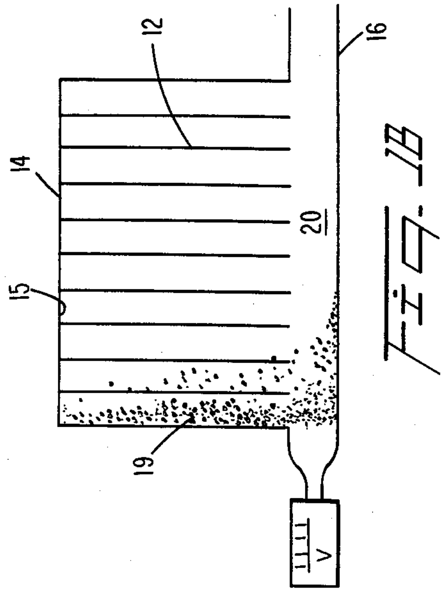
FIG. 1B corresponds to FIG. 1A just after voltage is applied and electron flow begins.
Figure 1D:
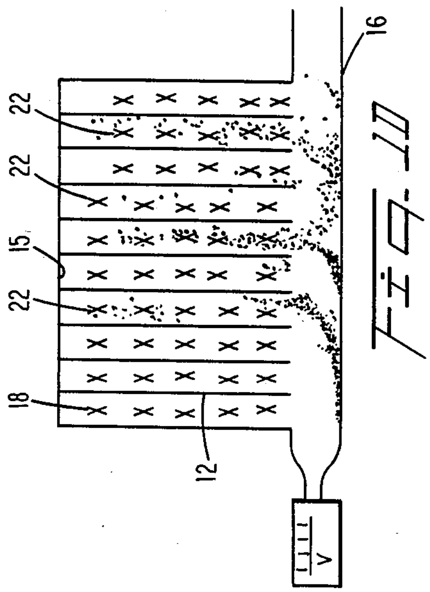
FIG. 1D corresponds to FIG. 1C when electron spoke formation associated with microwave generation thereafter takes place within the cavities in the slow-wave structures.
Figure 1A:
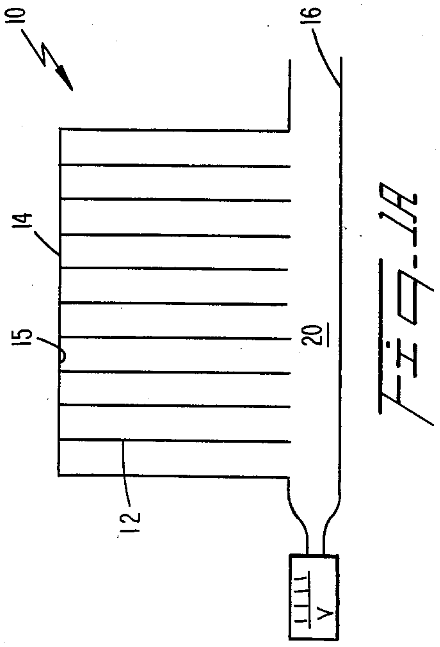
FIG. 1A is a schematic view of planar embodiment of the invention before voltage is applied.
Figure 1C:
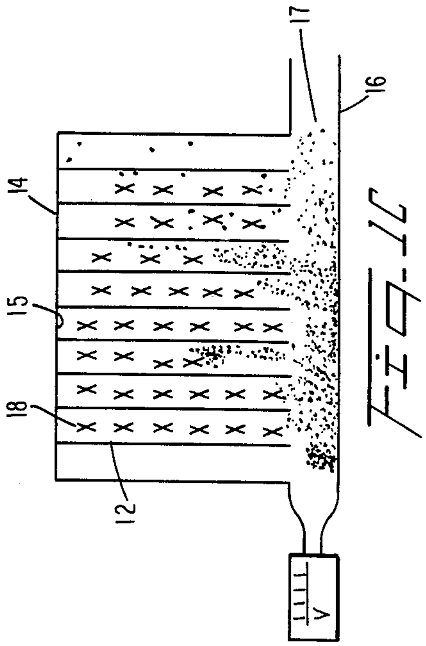
FIG. 1C corresponds to FIG. 1B when thereafter a self-generated magnetic field is produced by the electron flow and causes the electron flow to bend away from the anode.

In FIG. 1A, the planar oscillator embodiment 10, shown before pulsed voltage from a source V is applied, includes a family of vanes 12 extending outward from a planar anode vane support 14 toward a planar cathode 16. Cavities 15 are formed in the regions between the vanes 12. In FIG. 1B, just after a voltage on the order of 400 KV is applied and electron flow 17 begins, electrons 19 are expelled from the cold cathode 16 via electric field emission and flow freely upward across the gap 20 between the anode and cathode. Since a voltage applied at one end of the cathode is not instantaneously applied over the entire length of the cathode, electrons are excited first at the end closest to the power source. Over a very short, but finite, time, the applied voltage excites electrons down the length of the cathode. After this time, electrons are emitted from the whole length of the cathode. As shown in FIG. 1C a self-generated cross-field magnetic field 18 is produced by electron flow 17, causing electron flow to deflect from the anode vane support 14. The electrons 19 flow to the right, as shown in FIG. 1C because emitted from the cathode radially towards the anode create a transverse magnetic insulating field 18. The structure functions as a magnetically insulated transmission line where electrons emitted from the cathode near the power supply cannot cross the magnetic field set up by the return current in the anode from electrons emitted earlier in time. For a sufficiently high energy pulse and a sufficiently long transmission line, the magnetic insulation deflects electrons parallel to the axis of the cathode along the entire length of the cathode. The magnetic insulation ceases at the end of the transmission line opposite the power source because there is no return current at the end from further down the line. Accordingly, all electrons that have not been forced back into the cathode by the insulating magnetic field finally hit the anode, where they begin their return journey and contribute the magnetic insulation of later-generated electrons. The electrons interact with the vanes 12 to produce electromagnetic oscillations in the microwave range. Finally, in FIG. 1D electron spoke 22 formation associated with microwave generation takes place in the cavities 15 within the slow-wave structures.

Figure 2A:
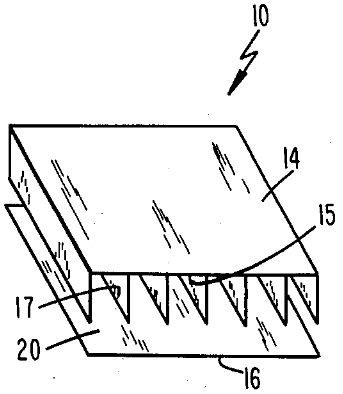
FIG. 2A is a planar magnetically insulated transmission line oscillator with a family of vanes extending from a planar anode vane support toward a planar cathode.
Figure 2B:
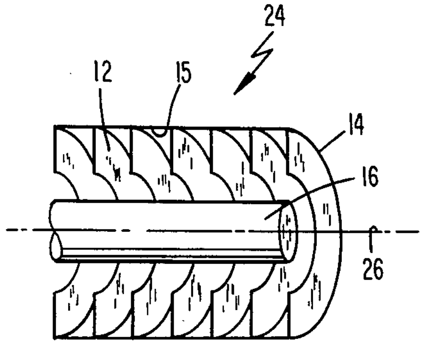
FIG. 2B is a sectional view of a coaxial magnetically insulated transmission line oscillator with a family of vanes in the form of flat circular vanes extending from an outer cylindrical anode vane support toward an inner elongated cathode, the family of vanes being arranged in parallel planes coaxially along the cathode.
Figure 2C:
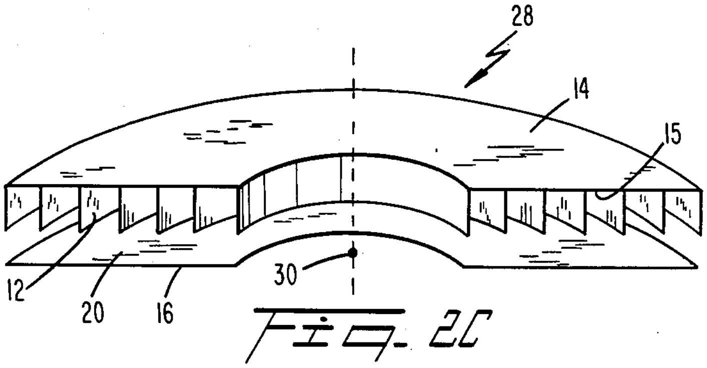
FIG. 2C is a concentric magnetically insulated transmission line oscillator having a family of curved vanes extending from a flat anode vane support toward a flat cathode, the family of vanes being in the form of cylindrical wall segments of successively increasing radii.

FIGS. 2A–2C show three embodiments of the invention. In FIG. 2A, a planar magnetically insulated transmission line oscillator 10 comprises a family of vanes 12 extending from a planar anode vane support 14 toward planar cathode 16. Cavities 15 are located between the vanes 12. In FIG. 2B, a coaxial magnetically insulated transmission line oscillator 24 comprises a family of vanes in the form of flat circular vanes 12 extending from an outer cylindrical anode vane support 14 toward an inner elongated cathode 16. In FIG. 2C, a concentric magnetically insulated transmission line oscillator 28 comprises a family of curved vanes extending from a flat anode vane support 14 toward a flat cathode 16. The family of curved vanes 12 is in the form of cylindrical wall segments of successively increasing radii on a common axis 30.

Although all the phenomena occurring within the magnetically insulated line transmission oscillator of the invention are not fully understood, a theoretical explanation is provided herein to lend greater understanding of the operation of the invention.

It has been discovered that a linear dispersion relation for a slow-wave structure such as is found in linear magnetrons and cross-field oscillators is applicable to the MILO of this invention. The relation is presented for other oscillators in R. E. Collin, Foundation for Microwave Engineering, McGraw-Hill, New York, New York, 1966, at page 482. The following equation, derived from the aforementioned work, is applicable to this invention:

$$cS(S-W) = 4\omega\tan(\omega D/c) \times \sum_n [\sin^2(\beta_n(S-W)/2)]/[\beta_n^2 h_n \tanh(h_n G)]$$

wherein:

$$\beta_n = k + 2\pi n/S,\ h_n = [\beta_n^2 - (\omega/c)^2]^{\frac{1}{2}},$$

c is the speed of light,
G is the anode-cathode gap,
D is the depth of the cavities,
S is the intercavity spacing, and
W is the width of the vane.

This relation can be solved numerically for the desired parameters to obtain the angular frequency $\omega$ as a function of the wave number, k.

Figure 3:
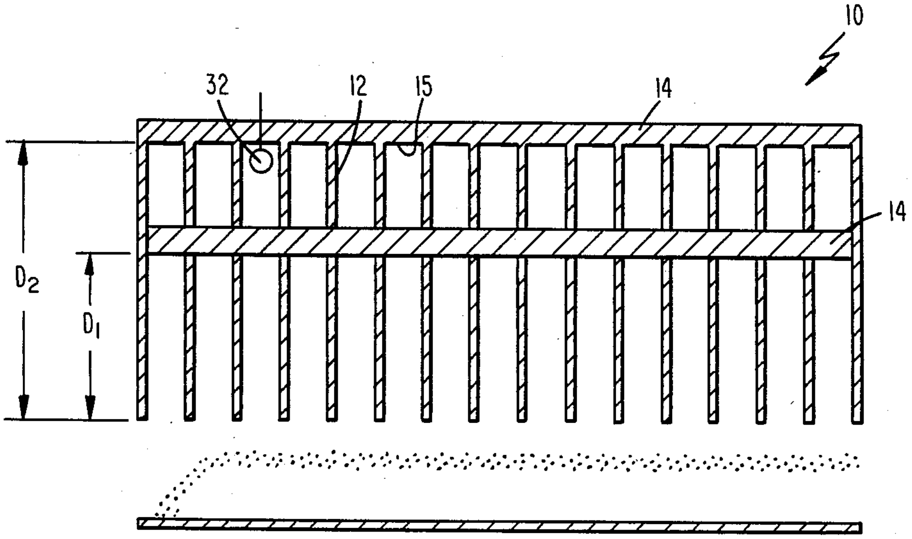
FIG. 3 is a planar MILO used as a model for computer simulation of an oscillator formed in accordance with the invention.

A planar MILO of the invention, shown in FIG. 3, is used as a model for the simulations described below. In addition, a planar oscillator of the invention such as shown in FIG. 3 is used for actual tests described below.

Figure 4A:
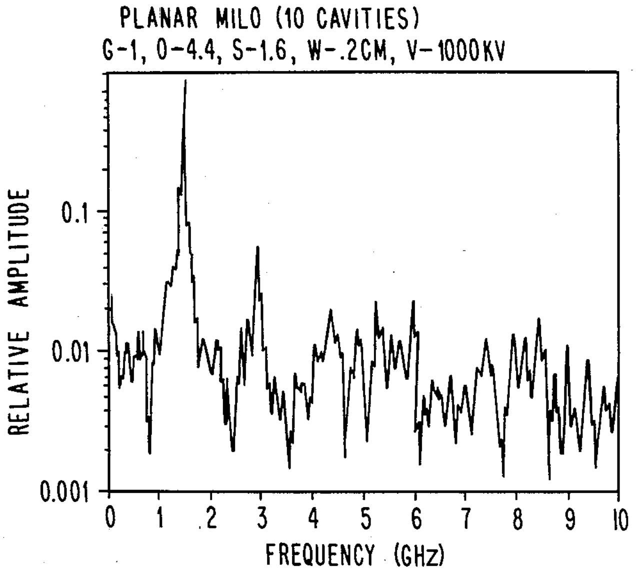
Figure 4B:
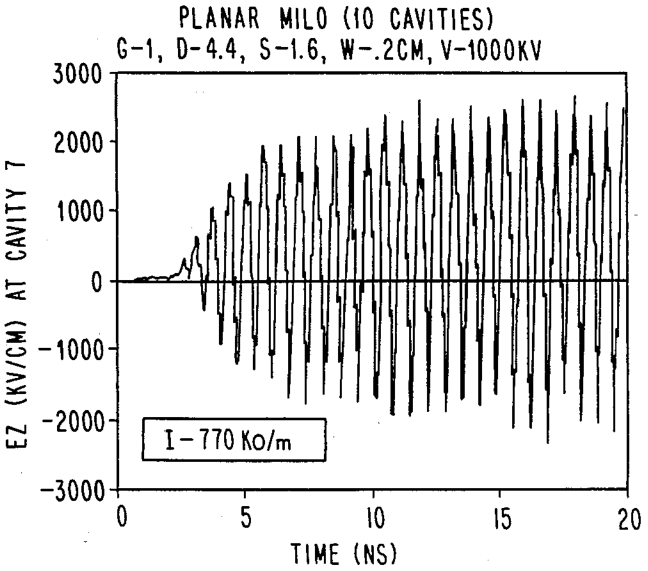
Figure 4C:
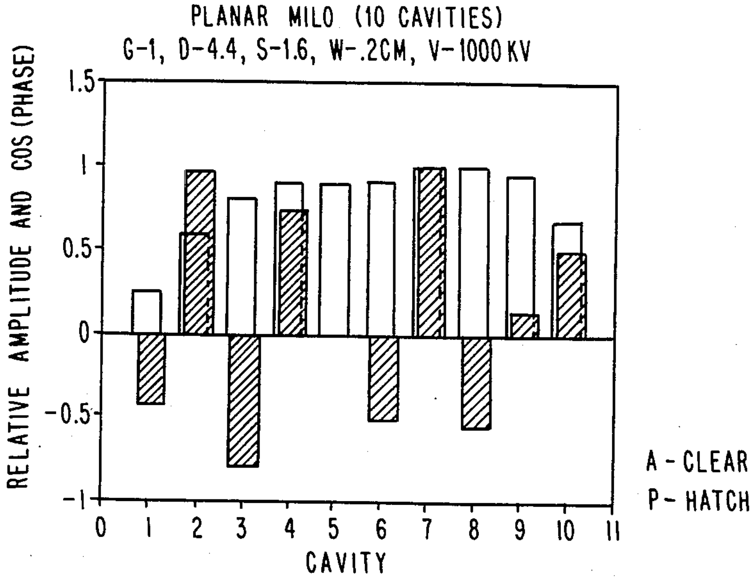

A 2D electromagnetic particle-in-cell computer code using an algorithm reported by B. M. Marder in J. Comp. Phys., 68, p. 48 (1987), has been used to study the MILO behavior of the invention. The results of one simulation are shown in FIG. 4A–C, wherein 10 slow-wave cavities are present in a planar MILO. The depth of the slow-wave cavities is 4.4 cm; the vane structures are 0.2 cm thick; the vanes are spaced 1.6 cm apart; the anode-cathode separation is 1 cm; and 1 MV of pulsed voltage is applied. The flow of microwave energy from this set of parameters is at a frequency of about 1.5 GHz.

In FIG. 4A, the spectrum of microwave frequencies, i.e., a graph of relative amplitude of the microwaves versus the frequency, is shown. In FIG. 4B, a graph of the cyclic variation of the longitudinal electric field is shown, the graph specifically shows the strength of the electric field in KV/cm versus time of the seventh cavity. In FIG. 4C, graphs on common axes show variation in other cavities with respect to the seventh cavity for the period between 10 and 20 ns. The clear bar graphs represent the amplitude of the oscillation in the other cavities with respect to the seventh cavity. The hatched bar graphs represent the cosine of the phase difference of the microwaves in the other cavities with respect to the seventh cavity.

With the simulation of FIGS. 4A–4C, approximate steady state is reached in about 5 ns at which time the flow becomes very turbulent and is dominated by the RF fields in the cavities. At this time, some 770 KA of electron current is drawn per meter of width of the oscillator (the "width" being along a plane perpendicular to the plane of the drawing in FIG. 3). The maximum amplitude of the RF electric field between vanes at the cavity mouth is typically twice the applied electric field.

Using the linear dispersion relation set forth above as a guide, it has been possible to achieve a high degree of modal purity in the simulations by altering the intercavity spacing S. Furthermore, if the depth D of the cavities is very deep compared to their width S, an odd number of quarter wavelengths of the TEM wave is developed with the RF fields penetrating relatively little into the anode-cathode gap of dimension G.

In addition to the computer simulations described above, tests of an actual magnetically-insulated microwave oscillator of the invention were conducted. A 400 kV, 50 kA, 50 ns beam generator located at Sandia National Laboratories was used. This beam generator operates at low impedance thereby providing a good match to existing pulsed power sources and allowing high power operation. The tested apparatus 10 of the invention shown in FIG. 3 is of a planar geometry having fifteen slow-wave cavities 15 wherein a small magnetic probe 32 was placed in the bottom of a selected slow-wave cavity and connected to an oscilloscope. The dimensions of the cavities 15 of the slow-wave structure were capable of being changed for different experiments. For example, one series of experiments was conducted with the cavity depth of 4.4 cm., and another series was conducted with the slow-wave cavity depth of 10 cm.

Figure 5A:
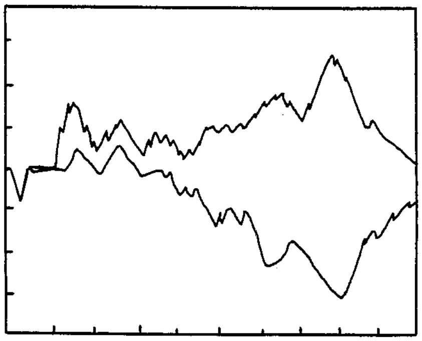
FIGS. 5A and 5B are oscilloscope traces of the relatively high frequency of self-generated magnetic fields when the depth of the slow-wave cavities is relatively shallow.

As shown in FIG. 5A, using a cavity depth of 4.4 cm ($D_1$ in FIG. 3), a voltage of 400 kV, and the magnetic probe 32 placed in the fifth cavity of a fifteen cavity planar slow-wave structure, a self-generated magnetic field was generated having a frequency of 1.4 GHz. In FIG. 5A, the oscilloscope resolution was 20 ns/division.

Figure 5B:
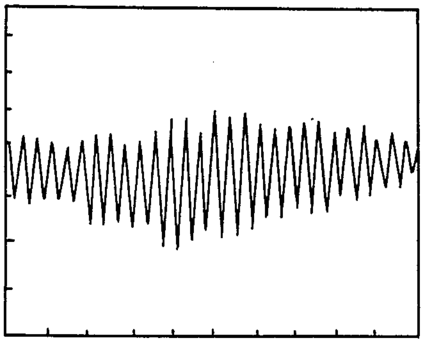

Similarly, as shown in FIG. 5B, using a cavity depth of 4.4 cm ($D_1$ in FIG. 3), a voltage of 400 kV, and the magnetic probe 32 placed in the fifth cavity of a fifteen cavity planar slow-wave structure, a self-generated magnetic field was developed having a frequency of 1.4 GHz. In FIG. 5B, the oscilloscope resolution was 5 ns/division.

Figure 6A:
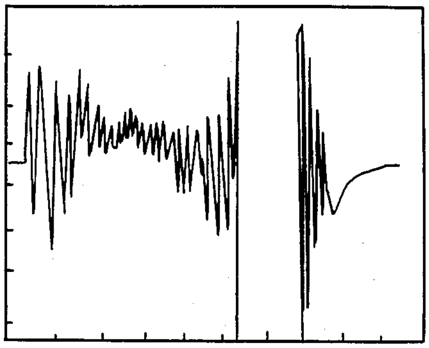
FIGS. 6A and 6B are oscilloscope traces of the relatively low frequency of self-generated magnetic fields when the depth of the slow-wave cavities is relatively deep.

As shown in FIG. 6A, using a slow-wave cavity depth of 10 cm ($D_2$ in FIG. 3), a voltage of 400 kV, and the magnetic probe 32 placed in the fifth cavity of a fifteen cavity planar slow-wave structure, a self-generated magnetic field was generated having a frequency of 720 MHz. in FIG. 6A, the oscilloscope resolution was 20 ns/division.

Figure 6B:
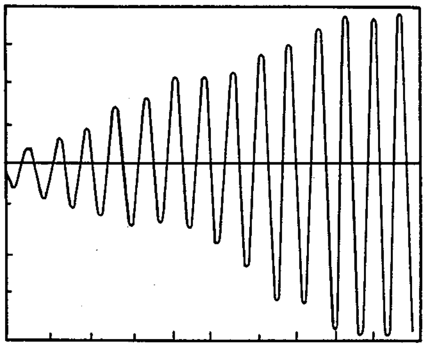

Similarly, as shown in FIG. 6B, using a cavity depth of 10 cm ($D_2$ in FIG. 3), a voltage of 400 kV, and the magnetic probe 32 placed in the fifth cavity of a fifteen cavity planar slow-wave structure, a self-generated magnetic field was generated having a frequency of 720

MHz. In FIG. 6B, the oscilloscope resolution was 5 ns/division.

Figure 7:
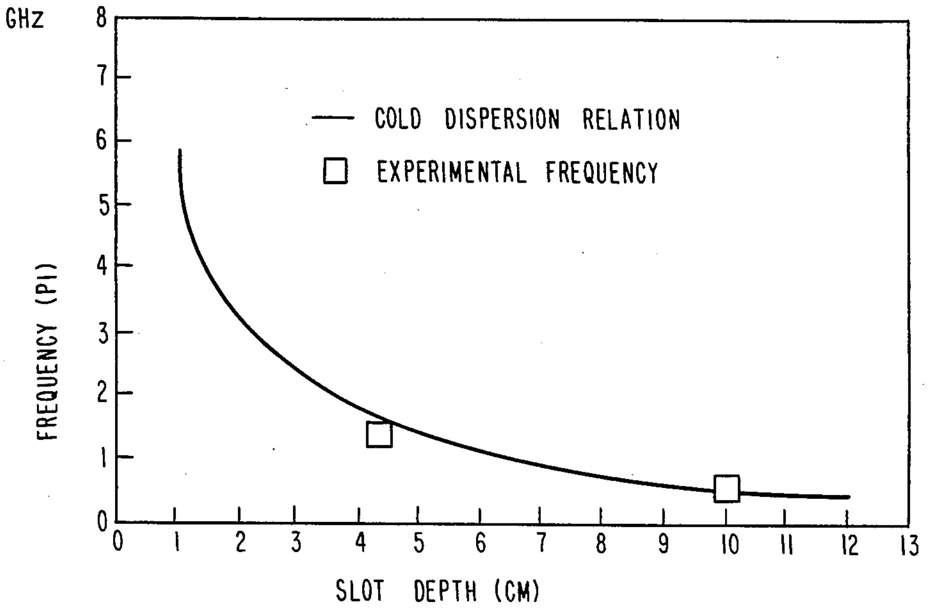
FIG. 7 is a graph of two measured frequencies and the corresponding theoretical frequencies obtained from a cold dispersion curve as well as computer simulations using the model shown in FIG. 3.

The experimental results observed in FIGS. 5A-6B were very close in comparison with predicted frequencies obtained from a cold dispersion curve and computer simulations shown in FIG. 7. The frequency of microwave emission can be varied over a range of from below 100 MHz to above 10 GHz simply by varying the depth of the cavities. In other words, the frequency can be varied by varying the height of the vanes of the apparatus of the invention although the spectrum of microwave emission does not vary between pulses of the pulsed power supply.

Advantageously, the apparatus has both simplicity of structure and operation. As such, the MILO of the invention is suitable for a wide variety of applications including fusion plasma heating, charged particle acceleration, and as a directed energy source exhibiting controlled power extraction and stable operation. The microwave oscillator of the invention can also be used in a high power, compact linear RF electron accelerator.

Figure 8:
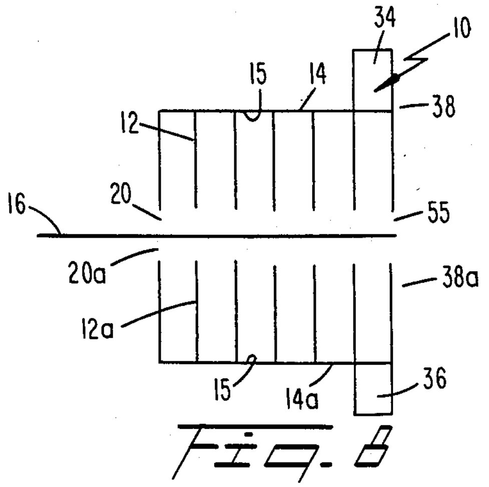
FIG. 8 is an idealized cross-sectional view of either a planar MILO or a coaxial MILO of the invention.

With reference to FIG. 8, the magnetically insulated transmission line oscillator 10 of the invention has a first anode vane support 14 and vanes 12 separated from a cathode 16 by a first gap 20. Also present is a second anode vane support 14*a* and vanes 12*a* separated from the cathode 16 by second gap 20*a*. This Fiure also shows output cavity 38, which cavity is discussed hereinafter.

In the case of a planar oscillator, the first and second anode supports, as well as the cathode, are planar. In the case of a coaxial oscillator, the first and second anode supports are hollow cylinders, and the cathode is elongated.

Figure 9:
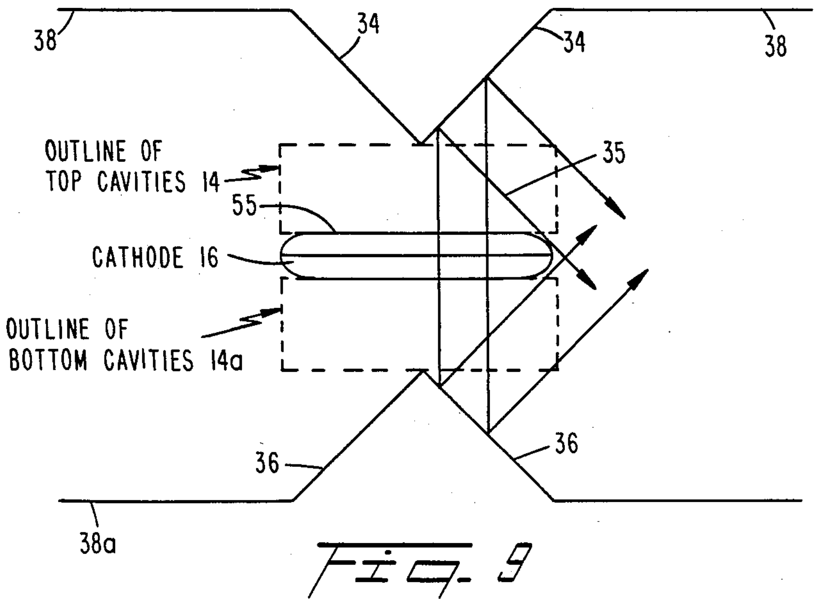
FIG. 9 is an idealized cross-sectional view of the output end of the MILO in FIG. 8 shhowing one embodiment of fa microwave coupler.
Figure 10:
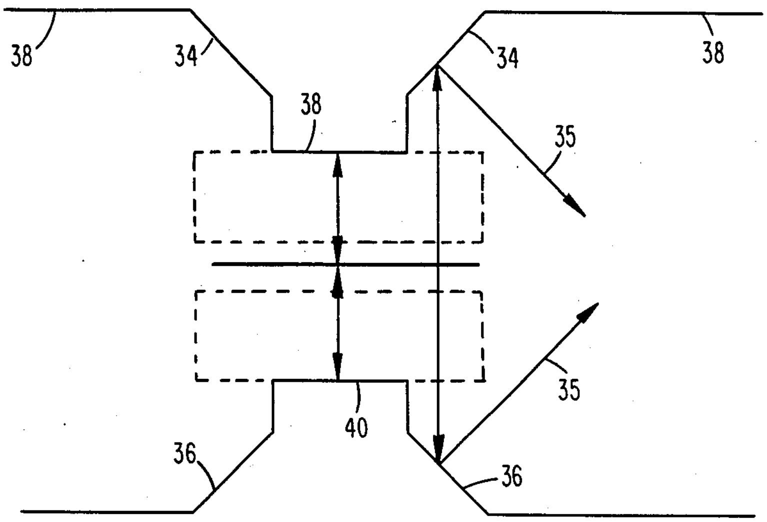
FIG. 10 is an idealized cross-sectional view of the MILO in FIG. 8 used in conjunction with a second embodiment of a microwave coupler.

The oscillator apparatus of FIG. 8 is provided at the output end with larger output cavities 38, 38*a* having a slot 55 through which extends cathode 16. This increase in size of the output cavity is seen in FIGS. 9 and 10 to be caused by reflecting surfaces 34 and 36 extending from a mid-point level with anode vane supports 14, 14*a* to the surfaces 38, 38*a* of a larger waveguide. For clarity, reflected waves are only shown towards the right; however, waves are reflected in each direction from the reflecting surfaces. The microwave energy is coupled into the waveguide where it all may be removed or transmitted using conventional techniques.

The configuration of the reflectors 34 and 36 enables substantially all of the microwaves to be reflected and directed into the output cavities. However, it may be desirable to adjust or regulate the amount of microwave energy entering the waveguide.

As shown in FIG. 10, upper blocking panel 38 and lower blocking panel 40 truncate reflectors 34 and 36, respectively. The microwaves from cathode 16 reflecting from the blocking panels is directed back to cathode 16, and this energy is not coupled to the output of the device. However, the microwaves from cathode 16 reflecting from reflectors 34 and 36 is output as discussed above. The amount of output may be controlled by varying the width of the blocking panels.

Although not shown, an alternative way to couple microwaves out of the oscillator is to provide one or more slots, covered by a microwave transparent material such as Kapton, that radiates energy directly into a waveguide. Such a coupling method is more useful with microwave oscillators employing only one anode than for preferred oscillators employing two anodes.

Figure 11:
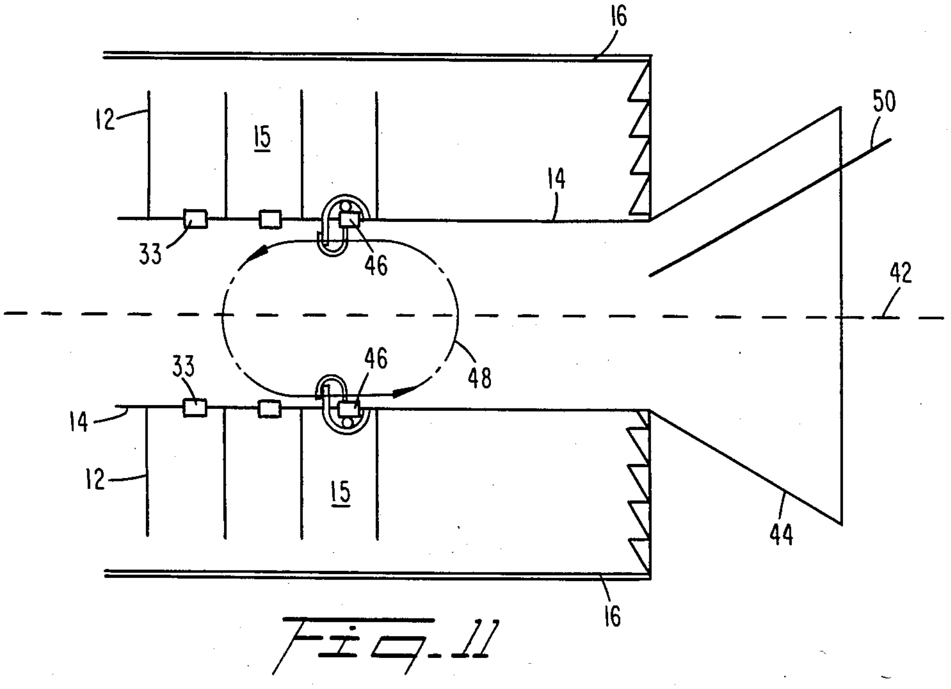
FIG. 11 is an idealized cross-sectional view of an inverted coaxial magnetically insulated transmission line oscillator employing wire loops for regulating microwave flow from the oscillator to the coupler.

In another embodiment of the invention, shown in FIG. 11, an inverted coaxial magnetically insulated transmission line oscillator includes a family of vanes 12 in the form of flat vanes extending form an inner elongated anode vane support 14 toward an outer cathode 16. The family of vanes is arranged in parallel planes along the anode support on a common axis 42. More specifically, the inner anode vane support 14 is in the form of a hollow cylinder around which the vanes 12 defining cavities 15 project. Slots 33 in the cylindrical anode support 14 permit microwaves to propagate from the microwave cavities and enter the interior of the hollow anode support. The hollow anode support 14 serves as a waveguide for transmitting the microwaves to a microwave radiator such as horn 44.

Passage of microwaves from a cavity 15, through a slot 33, and into the waveguide interior of the anode support 14 is controlled by a novel dual wire loop 46. The loop 46 establishes a high current, low voltage device for controlling the flow of microwaves from the cavities to the waveguide. The high current and low voltage of the dual loop reduce electrical breakdown problems when high microwave powers are used.

Dual coupling loops 46 not only couple energy from the MILO cavities, but also provide a means for selecting certain microwave energy modes. A single loop couples energy in a waveguide most efficiently when it is perpendicular to the magnetic mode in the waveguide to be coupled. Accordingly, dual coupling loops 46 are parallel to the axis of the transmission line to permit TE11-type microwave modes to enter the cylindrical waveguide by coupling to appropriate magnetic field lines in the cavity. At the same time, portion of the dual coupling loops within the waveguide are arranged perpendicular to the axis of the waveguide to prevent undesired TMOn microwave modes from entering the waveguide.

Using dual coupling loops 46 for controlling passage of microwaves through slots 33 in the hollow cylindrical anode support 14 of an inverted coaxial magnetically insulated transmission line oscillator, a fixed-polarization pencil beam 50 of microwaves can be created to emerge from a conical horn 44 microwave radiator located at one end of the hollow anode support.

By employing the principles of the invention a magnetically insulated microwave oscillator is provided in which the self-generated magnetic field continuously and automatically adjusts to fluctuations in the voltage applied to the oscillator thereby eliminating the need to constantly match the voltage applied to the oscillator with the voltage applied to external electromagnets. Thus, there is no need to fine tune the magnetic field to match the voltage applied to the oscillator. Instead, fine tuning is accomplished inherently by operation of the self-generated magnetic insulating field.

In addition, in accordance with the invention, the following characteristics are achieved:

1. A magnetically insulated microwave oscillator is provided that has a lower inherent impedance than known oscillators so that it can operate at significantly higher power levels.
2. A magnetically insulated microwave oscillator is provided in which there is a reduced tendency toward electrical breakdown when high voltages are utilized.
3. A microwave oscillator is provided in which the spectrum of the oscillation is very insensitive to applied voltage. As a result, the oscillator does not change frequency or "chirp" with a variation in applied voltage.

4. A magnetically insulated microwave energy generator is provided in which controllable change of produced frequency is readily accomplished by changing the depth of the cavities in the slow-wave structures.
5. A microwave coupler is provided that is less limited with respect to the coupler's power handling capability.
6. A microwave coupler is provided that combines outputs from both sides of the oscillator.
7. A microwave coupler is provided that does not require many waveguides or coaxial transmission lines for accommodating wide oscillator structures.
8. A microwave coupler is provided which permits easy and convenient regulation of the amount of microwave energy coupled into a waveguide.

The foregoing description of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A magnetically insulated transmission line microwave oscillator, comprising:

an elongated cathode;

anode structure comprising a first anode including slow-wave structures and a support for said slow-wave structures, said slow-wave structures comprising a plurality of thin conductive vanes arrayed as a family of parallel surfaces extending from said support towards said cathode, said vanes defining slow-wave cavities between said vanes;

said cathode and first anode forming a gap therebetween and defining a low impedance transmission line; and pulsed power means, connected to said cathode and first anode, for producing field emitted electrons and an electric field in said gap, said electrons producing self-generated magnetic fields in a cross-field orientation with respect to the orientation of the electric field, only said cross-field magnetic fields insulating a flow of electrons in said gap and confining the flow of electrons within said gap;

microwave energy being generated by an interaction of electrons parallel to said cathode with oscillating modes of said slow-wave cavities perpendicular to said cathode, said interaction producing intense electron bunching and microwave radiation.

2. The microwave oscillator of claim 1, further including:

a second anode including slow-wave structures and a support for said slow-wave structures, said slow-wave structures comprising a plurality of conductive vanes arranged as a family of parallel surfaces extending from said support toward said cathode, said vanes defining cavities between said vanes, said second anode being located on an opposite side of said cathode from said first anode, said cathode and said second anode forming another gap.

3. The microwave oscillator of claim 1 wherein said support and said cathode are planar.

4. The microwave oscillator of claim 3, further including:

a second family of vanes extending from a second planar anode vane support toward said planar cathode, said second family of vanes being located on an opposite side of said planar cathode from said first family of vanes.

5. The microwave oscillator of claim 1, wherein said vanes are in the form of flat vanes extending from an outer cylindrical anode vane support toward said cathode, said cathode being elongated and said family of vanes being arranged in parallel planes coaxially along said elongated cathode.

6. The microwave oscillator of claim 1, wherein said family of vanes is in the form of flat vanes extending from an inner elongated anode vane support toward an outer cathode, said family of vanes being arranged in parallel planes coaxially along said elongated anode support.

7. The microwave oscillator of claim 1, wherein said family of vanes is in the form of curved vanes extending from a flat anode vane support toward a flat cathode, said curved vanes comprising cylindrical wall segments of successively increasing radii on a common axis.

8. The microwave oscillator of claim 3 further comprising:

first reflecting means for reflecting microwaves radiating outward from said cathode in a direction away from the cathode; and waveguide means for receiving the reflected waves from said first reflecting means.

9. The microwave oscillator of claim 2, further including:

first reflecting means for reflecting microwaves radiating outward from said cathode in a direction away from said cathode;

second reflecting means for reflecting microwaves radiating outward from the opposite side of said cathode in said direction away from said cathode; and waveguide means for receiving the reflected waves from said first and second reflecting means.

* * * * *